(12) United States Patent
Yoo et al.

(10) Patent No.: US 7,718,523 B1
(45) Date of Patent: May 18, 2010

(54) SOLDER ATTACH FILM AND METHOD OF FORMING SOLDER BALL USING THE SAME

(75) Inventors: Min Yoo, Seoul (KR); Tae Seong Kim, Kyunggi-do (KR); Ji Young Chung, Kyunggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 179 days.

(21) Appl. No.: 11/875,597

(22) Filed: Oct. 19, 2007

(51) Int. Cl.
*H01L 21/44* (2006.01)

(52) U.S. Cl. .................. 438/613; 257/737; 257/738; 257/E23.012; 257/E23.069; 257/E21.508

(58) Field of Classification Search .................. 438/459, 438/613; 257/737, 738, E23.021, E23.069, 257/E21.508
See application file for complete search history.

(56) References Cited

U.S. PATENT DOCUMENTS 6,249,963 B1 * 6/2001 Chou et al. .................. 29/843
6,930,031 B2 * 8/2005 Huang ........................ 438/612
2007/0145548 A1 * 6/2007 Park et al. ................... 257/678

* cited by examiner

*Primary Examiner*—Matthew C Landau
*Assistant Examiner*—Yu-Hsi Sun
(74) *Attorney, Agent, or Firm*—Gunnison, McKay & Hodgson, L.L.P.; Serge J. Hodgson

(57) ABSTRACT

A solder attach film includes a first cover film, a flux layer, a solder layer, and a second cover film, and it can be treated or kept in a roll shape. A solder ball forming method using the solder attach film includes preparing a semiconductor package or a semiconductor die, adhering the solder attach film, gridding, and reflowing. In the solder attach film adhering operation, the first cover film and the second cover film are removed, and the flux layer is adhered to electrically conductive pads of the semiconductor package or the semiconductor die. Subsequently, in the reflowing operation, the flux layer is volatilized and removed, and the solder layer is fused and fixed to the electrically conductive pads, so that solder balls are formed.

7 Claims, 10 Drawing Sheets

SOLDER ATTACH FILM AND METHOD OF FORMING SOLDER BALL USING THE SAME

BACKGROUND OF THE INVENTION

1. Field of the Invention

The present invention relates to a solder attach film and a method of forming a solder ball using the same.

2. Description of the Related Art

In general, a semiconductor package protects a semiconductor die from external heat, humidity, and mechanical load, and provides an electrical passage for allowing an electrical signal from the semiconductor die to be transmitted to a main board.

The semiconductor package may include a substrate, a semiconductor die that is adhered to the substrate so as to be electrically connected thereto, an encapsulant for encapsulating the semiconductor die, solder balls that are fused and fixed to the substrate so as to be electrically connected to the main board.

The solder balls are generally formed on the substrate through dotting flux, dropping solder ball, and reflowing solder ball. Dotting the flux is that a predetermined amount of flux that has predetermined viscosity and is volatilized at a high temperature is dotted on electrically conductive pads of the substrate. Dropping the solder ball is that solder balls are dropped on the flux to be temporarily fixed to the flux. Reflowing is that the substrate is put into a high-temperature furnace. Then, the flux is volatilized and removed, and the solder balls are fused to be electrically and mechanically connected to the electrically conductive pads of the substrate.

As described above, in the related art, the solder balls are formed on the substrate by dotting the flux, dropping the solder ball, and reflowing in sequence. Of course, a flux dotting apparatus, a solder ball dropping apparatus, and a reflow apparatus are needed to perform these processes.

Therefore, the related art requires many processes and apparatuses, which causes problems that it takes a lot of time to form the solder balls and a defect rate in a solder ball manufacturing process increases. For example, when the solder ball does not drop at an exact position when dropping the solder ball, solder balls may be doubly formed on one electrically conductive pad, or no solder ball may be formed thereon.

Further, the related art uses expensive solder balls, which causes an increase in a packaging cost. That is, the smaller the diameter of the solder ball, the higher the manufacturing cost of the solder ball. Therefore, in recent years, solder balls having a smaller size need to be used in order to minimize pitches and reduce the size of a chip. Thus, the packaging cost is on an increasing trend.

Of course, as described above, in the related art, the flux dotting apparatus and the solder ball dropping apparatus are necessarily used to form the solder balls, which causes an increase in the initial cost of the apparatuses.

BRIEF SUMMARY OF THE INVENTION

In accordance with one embodiment, a solder attach film includes a first cover film, a flux layer, a solder layer, and a second cover film, and it can be treated or kept in a roll shape. A solder ball forming method using the solder attach film includes preparing a semiconductor package or a semiconductor die, adhering the solder attach film, gridding, and reflowing. In the solder attach film adhering operation, the first cover film and the second cover film are removed, and the flux layer is adhered to electrically conductive pads of the semiconductor package or the semiconductor die. Subsequently, in the reflowing operation, the flux layer is volatilized and removed, and the solder layer is fused and fixed to the electrically conductive pads, so that solder balls are formed.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
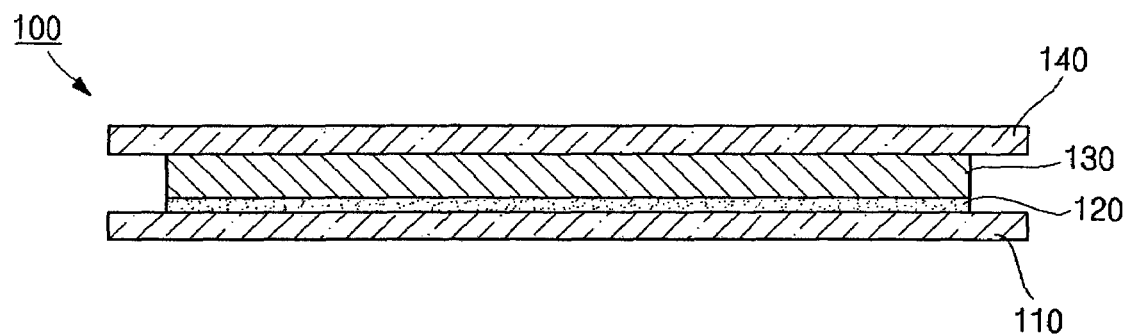
FIG. 1 is a cross-sectional view of a solder attach film according to an embodiment of the invention.

Referring to FIG. 1, a cross-sectional view of a solder attach film according to an embodiment of the invention is illustrated.

As shown in FIG. 1, a solder attach film 100 according to an embodiment of the invention includes a first cover film 110, a flux layer 120, a solder layer 130, and a second cover film 140.

The first cover film 110 is a substantially planar film or planar tape. In addition, the first cover film 110 may be formed of any insulating or conductive material that does not chemically and physically interact with the flux layer 120. Further, the first cover film 110 may be formed of a flexible material such that the solder attach film 100 of the present invention is treated or kept in a roll shape. Further, the first cover film 110 may be formed of a material capable of being easily separated from the flux layer 120. In addition, the first cover film 110 may be formed of a material for allowing only the flux layer 120 to minimally remain on the first cover film 110 when the first cover film 110 is separated from the flux layer 120.

The flux layer 120 is adhered to the surface of the first cover film 110. The flux layer 120 may be formed of resin, an activator, or a solvent, but the material forming the flux layer 120 is not limited thereto. The flux layer 120 is used to clean the surface of the solder layer 130, prevent the reoxidation thereof, and reduce the surface tension thereof when the solder layer 130 is fused. Further, the flux layer 120 should be formed with a thickness larger than a predetermined value. This is because, when the thickness of the flux layer 120 is smaller than the predetermined value, viscosity is lowered, which makes it difficult to smoothly perform manufacturing processes.

The solder layer 130 is formed on the flux layer 120. The solder layer 130 may be formed of a material selected from a Sn—Pb alloy, a Sn—Pb—Ag alloy, a Sn—Ag alloy, a Sn—Ag—Cu alloy, a Sn—Pb—Bi alloy, and equivalents thereof, but the material forming the solder layer 130 is not limited thereto. As described above, when the solder layer 130 contains silver (Ag), the conductivity of the solder layer 130 is further improved. In addition, as described above, when the solder layer 130 contains bismuth (Bi), the melting point of the solder layer 130 is lowered. Additionally, in recent years, since the diameter of the solder ball formed on the semiconductor die or the semiconductor package is in the range of about 1 to 100 micrometers, it is suitable that the thickness of the solder layer 130 be in the range of about 1 to 100 micrometers.

The second cover film 140 is a substantially planar film or planar tape. The second cover film 140 may be formed of any material that does not chemically and physically interact with the solder layer 130. In addition, the second cover film 140 may be formed of a flexible material such that the solder attach film 100 of the present invention is treated or kept in a roll shape. Further, the second cover film 140 may be formed of a material capable of being easily separated from the solder layer 130. In addition, the second cover film 140 may be formed of a material for allowing only the solder layer 130 to minimally remain on the second cover film 140 when the second cover film 140 is separated from the solder layer 130. For example, the second cover film 140 may be formed of a polymer such as PET, PE, or PO.

Figure 2:
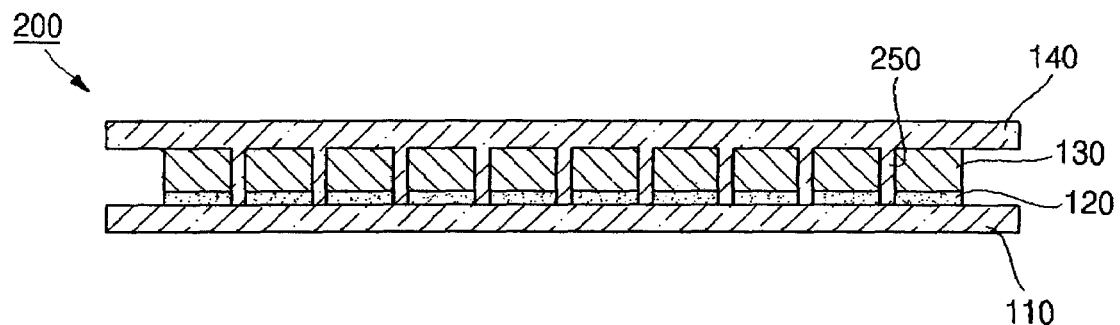
FIG. 2 is a cross-sectional view of a solder attach film according to another embodiment of the invention.

Referring to FIG. 2, a cross-sectional view of a solder attach film according to another embodiment of the invention is illustrated.

As shown in FIG. 2, a solder attach film 200 according to another embodiment of the invention is similar to the solder attach film 100 in shape. Therefore, only the difference between them will be described below.

As shown in FIG. 2, the solder attach film 200 according to another embodiment of the invention may further include one or more barrier ribs 250. The barrier ribs 250 are disposed between the first cover film 110 and the second cover film 140 and simultaneously, penetrate the flux layer 120 and the solder layer 130. More specifically, the barrier ribs 250 are provided substantially in the vertical direction with respect to the first cover film 110 and the second cover film 140. Further, the barrier ribs 250 may be formed of the same material as the second cover film 140. When the second cover film 140 is separated from the solder layer 130, the barrier ribs 250 are separated together with the second cover film 140. That is, the barrier ribs 250 are separated from the first cover film 110, the flux layer 120, and the solder layer 130, when the second cover film 140 is separated from the solder layer 130. In addition, the barrier ribs 250 cause a separate grid process to be omitted, which will be described in detail below. That is, after the solder attach film 100 is adhered to the semiconductor die or the semiconductor package, a grid process of making the flux layer 120 and the solder layer 130 remain in only an area corresponding to the electrically conductive pads is performed on the solder attach film 100. At this time, the solder attach film 200 having the barrier ribs 250 does not require the grid process. In other words, the barrier rib 250 is formed in only an area corresponding to the outer circumference of the electrically conductive pad in the semiconductor die or the semiconductor package. Therefore, when the barrier rib is removed, the grid process should be performed.

Figure 3:
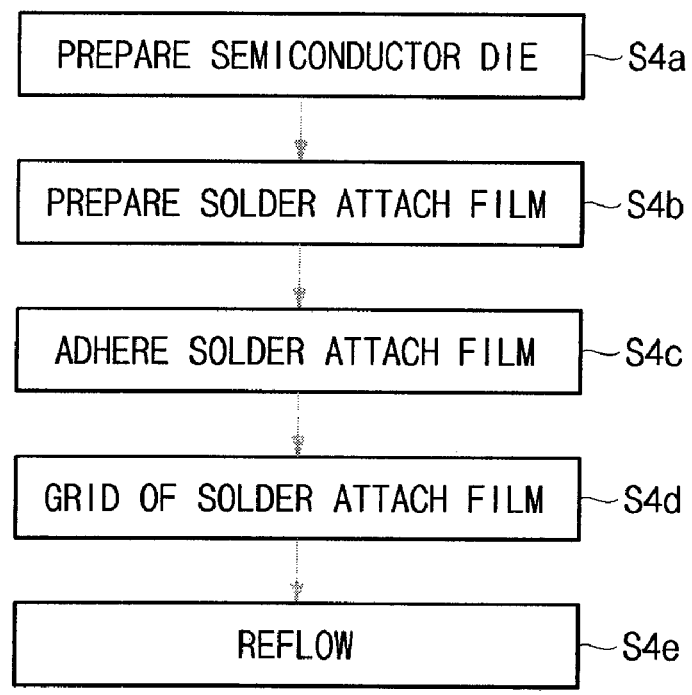
FIG. 3 is a flowchart of a solder ball forming method according to an embodiment of the invention.

Referring to FIG. 3, a flowchart of a solder ball forming method according to an embodiment of the invention is illustrated.

As shown in FIG. 3, the solder ball forming method according to the embodiment of the invention includes a prepare semiconductor die operation S4a, a prepare solder attach film operation S4b, an adhere solder attach film operation S4c, a grid of solder attach film operation S4d, sometimes called a gridding operation, and a reflow operation S4e.

Referring to FIGS. 4A to 4E, cross-sectional views of the solder ball forming method shown in FIG. 3 are illustrated.

Figure 4A:
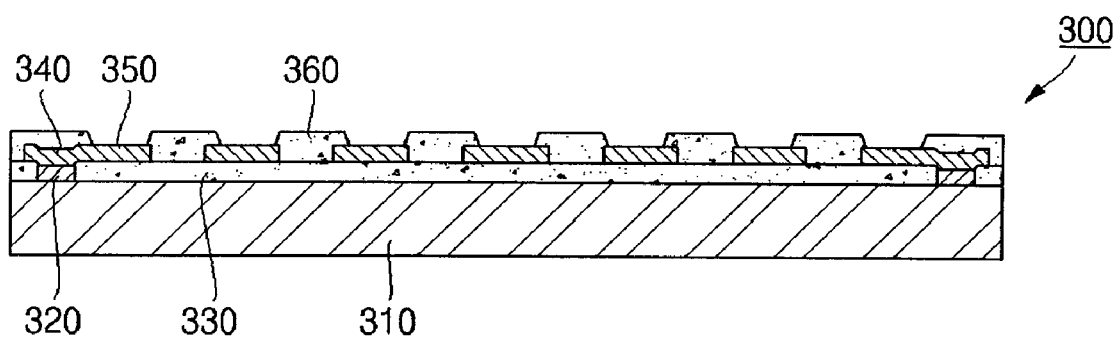
FIGS. 4A to 4E are cross-sectional views sequentially illustrating the solder ball forming method shown in FIG. 3.

As shown in FIG. 4A, in prepare semiconductor die operation S4a, a semiconductor die having a plurality of electrically conductive pads on the surface thereof is prepared. For example, a semiconductor die 300 may include a semiconductor substrate 310, a plurality of bond pads 320 formed on the semiconductor substrate 310, and a protective layer 330 formed in the outer circumferences of the bond pads 320. Further, the semiconductor die 300 may include a redistribution layer 340 formed on the bond pads 320 and electrically conductive pads 350 formed at the edge of the redistribution layer 340. Of course, the semiconductor die 300 may include another protective layer 360 that is formed in the outer circumferences of the electrically conductive pads 350 and on the redistribution layer 340. In addition, the electrically conductive pad 350 may be formed right on the bond pad 320, but the position of the electrically conductive pad 350 is not limited thereto.

Figure 4B:
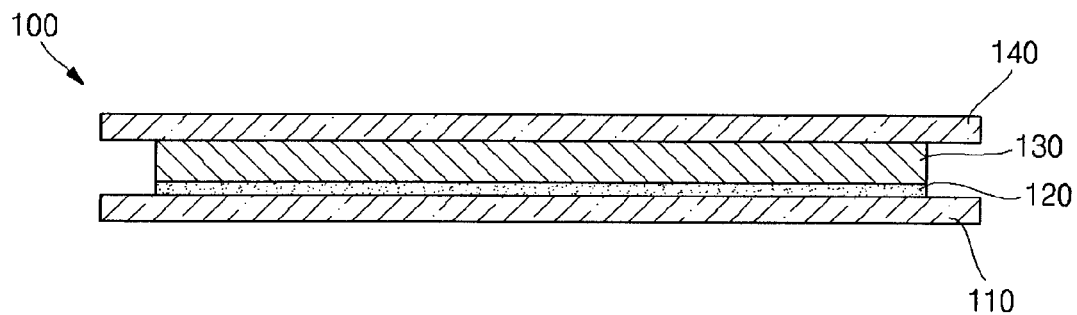

As shown in FIG. 4B, in prepare solder attach film operation S4b, a solder attach film 100 including a first cover film 110, a flux layer 120 formed on the first cover film 110, a solder layer 130 formed on the flux layer 120, and a second cover film 140 formed on the solder layer 130 is prepared. Further, although not shown in FIG. 4B, the solder attach film 200 (see FIG. 2) further including the barrier ribs 250 that are provided between the first cover film 110 and the second cover film 140 so as to penetrate the flux layer 120 and the solder layer 130 may be prepared. Since the solder attach film has been described above, a detailed description thereof will be omitted. In addition, materials forming the first cover film 110, the flux layer 120, the solder layer 130, the second cover film 140, and the barrier ribs 250 have been described in detail above, and thus a detailed description thereof will be omitted.

Figure 4C:
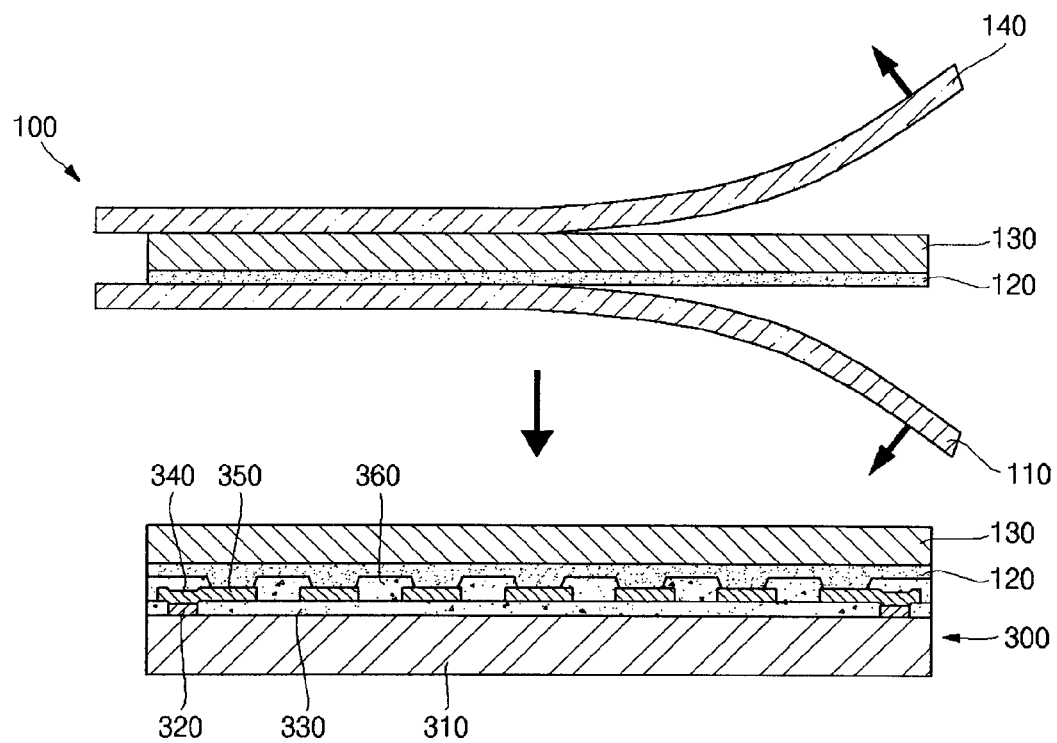

As shown in FIG. 4C, in adhere solder attach film operation S4c, the first cover film 110 is removed from the solder attach film 100, and the flux layer 120 is adhered to the electrically conductive pads 350 formed on the semiconductor substrate 310 of the semiconductor die 300. Of course, the electrically conductive pad 350 is disposed at a position slightly lower than the protective layer 360, but the flux layer 120 is adhered to both the protective layer 360 and the electrically conductive pads 350 well since it has a little flexibility. Subsequently, the second cover film 140 is removed from the solder attach film 100, so that the solder layer 130 is exposed to outside.

Figure 4D:
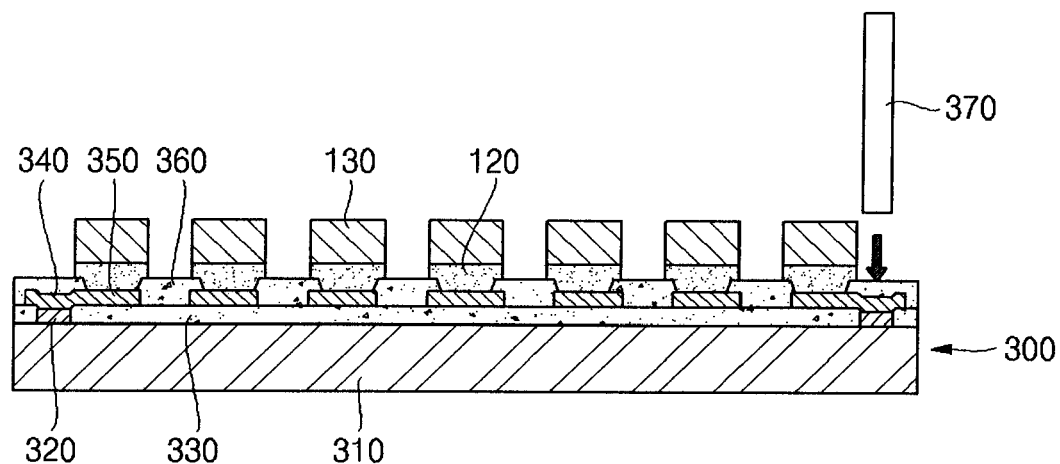

As shown in FIG. 4D, in grid of solder attach film operation S4d, the flux layer 120 and the solder layer 130 remain in only the areas corresponding to the electrically conductive pads 350, and the flux layer 120 and the solder layer 130 in the other areas not corresponding to the electrically conductive pads 350 are removed. For example, a blade or a laser 370 is used to remove the flux layer 120 and the solder layer 130 from the areas not corresponding to the electrically conductive pads 350. Herein, when the solder attach film 200 including the barrier ribs 250 is used, the gridding is not needed. That is, when the second cover film 140 and the barrier ribs 250 are removed, the gridding is being spontaneously performed since the barrier ribs 250 have already been formed in the areas corresponding to the outer circumferences of the electrically conductive pads 350.

Figure 4E:
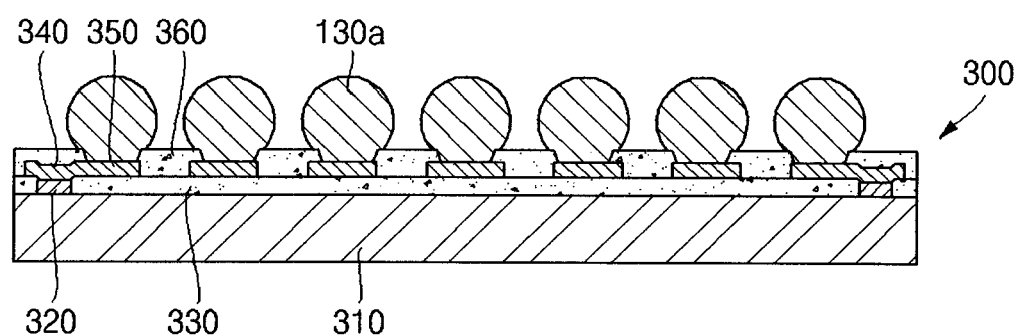

As shown in FIG. 4E, in reflow operation S4e, the semiconductor die 300, the flux layer 120, and the solder layer 130 are put into a furnace. Then, the flux layer 120 is volatilized and removed, and the solder layer 130 is fused and fixed to the electrically conductive pads 350, so that solder balls 130a are formed. Here, when the solder layer 130 is fused, the solder layer 130 has a spherical shape due to the surface tension thereof. Therefore, when the solder balls 130a are cooled down, they have spherical shapes. In addition, the internal temperature of the furnace is set in the range of about 150 to 250° C., which makes it possible to sufficiently fuse the solder layer 130.

Figure 5:
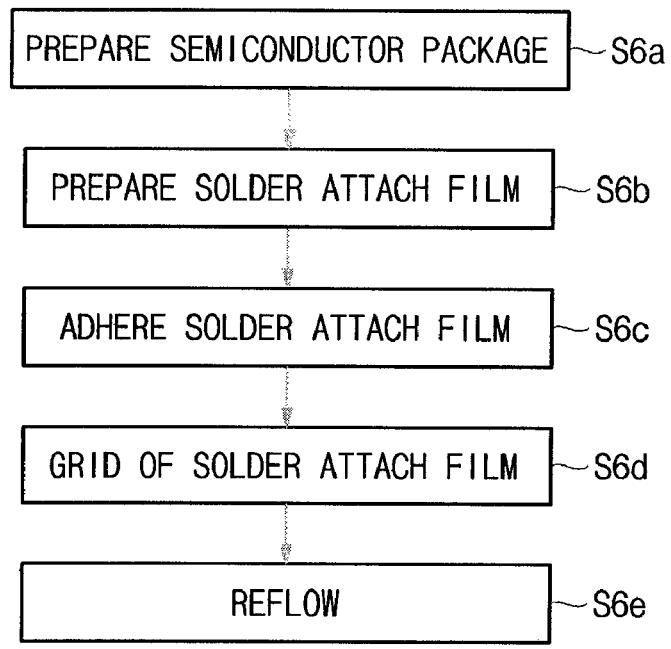
FIG. 5 is a flowchart of a solder ball forming method according to another embodiment of the invention.

Referring to FIG. 5, a flowchart of a solder ball forming method according to another embodiment of the invention is illustrated.

As shown in FIG. 5, the solder ball forming method according to another embodiment of the invention includes a prepare semiconductor package operation S6a, a prepare solder attach film operation S6b, an adhere solder attach film operation S6c, a grid of solder attach film operation S6d, and a reflow operation She.

Referring to FIGS. 6A to 6E, cross-sectional views of the solder ball forming method shown in FIG. 5 are illustrated.

Figure 6A:
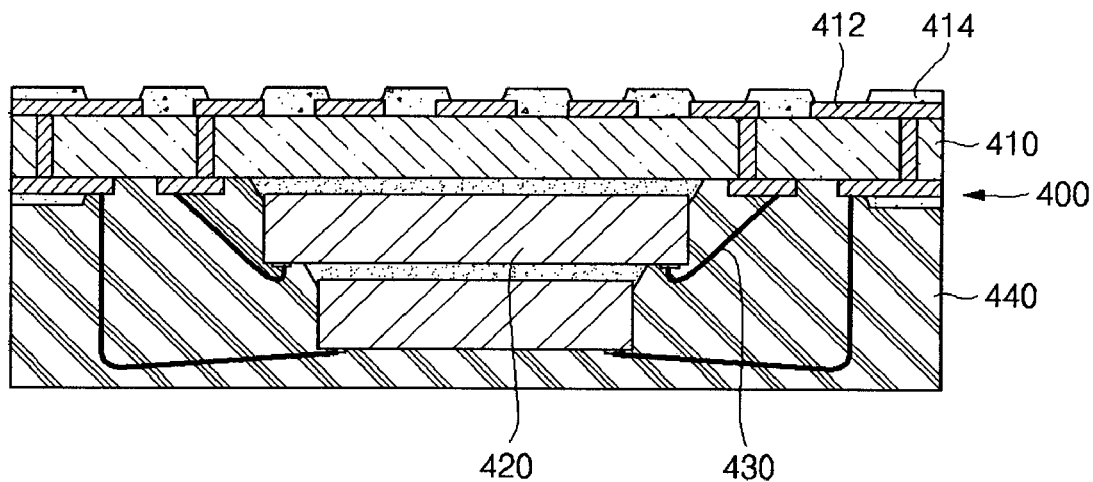
FIGS. 6A to 6E are cross-sectional views sequentially illustrating the solder ball forming method shown in FIG. 5.

As shown in FIG. 6A, in prepare semiconductor package operation S6a, a semiconductor package 400 including a semiconductor die 420 electrically connected to the substrate 410 and a plurality of electrically conductive pads 412 formed on the substrate 410 is prepared. For example, the semiconductor package 400 may include the substrate 410 having a plurality of electrically conductive pads 412 formed thereon, at least one semiconductor die 420 adhered to the substrate 410, one or more electrically conductive wires 430 for electrically connecting the substrate 410 and the semiconductor die 420, and an encapsulant 440 for encapsulating the semiconductor die 420 and the electrically conductive wires 430. On the electrically conductive pads 412 formed on the substrate 410, the solder ball 130a is fused and fixed to a portion of the electrically conductive pad 412, and the other portions of each electrically conductive pad 412 are covered with a protective layer 414. The semiconductor package 400 is just an illustrative example for explaining the method of forming the solder balls 130a according to the present invention, but the invention is not limited to the semiconductor package 400 according to the embodiment of the invention.

Figure 6B:
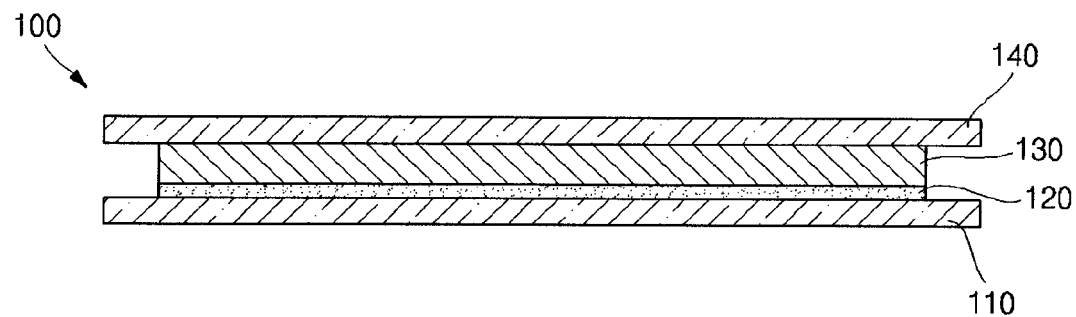

As shown in FIG. 6B, in prepare solder attach film operation S6b, the solder attach film 100 including the first cover film 110, the flux layer 120 formed on the first cover film 110, the solder layer 130 formed on the flux layer 120, and the second cover film 140 formed on the surface of the solder layer 130 is prepared. Although not shown in FIG. 6B, the solder attach film 200 (see FIG. 2) further including the barrier ribs 250 that are provided between the first cover film 110 and the second cover film 140 so at to penetrate the flux layer 120 and the solder layer 130 may be prepared.

Figure 6C:
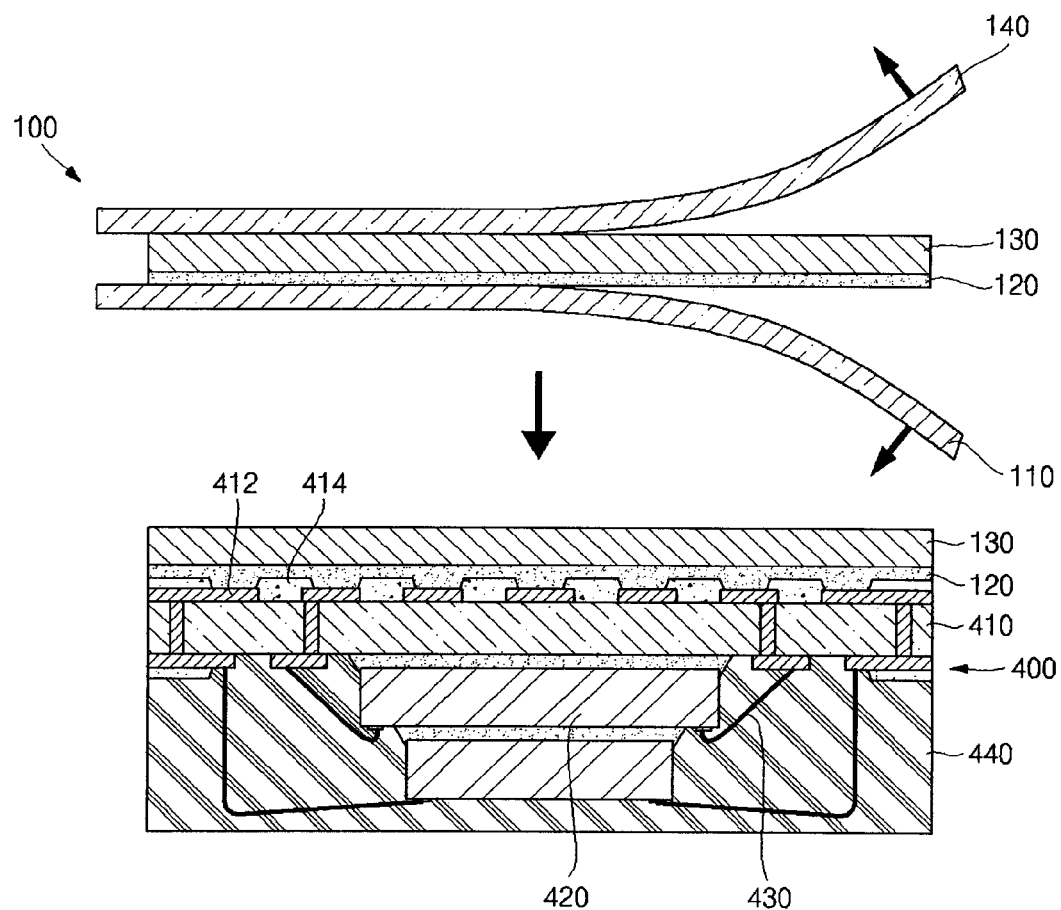

As shown in FIG. 6C, in adhere solder attach film operation S6c, the first cover film 110 is removed from the solder attach film 100, and the flux layer 120 is adhered to the electrically conductive pads 412 formed on the substrate 410 of the semiconductor package 400. The electrically conductive pad 412 is disposed at a position slightly lower than the protective layer 414, but the flux layer 120 is adhered to both the protective layer 414 and the electrically conductive pads 412 well since it has a little flexibility. Subsequently, the second cover film 140 is removed from the solder attach film 100, so that the solder layer 130 is exposed to outside.

Figure 6D:
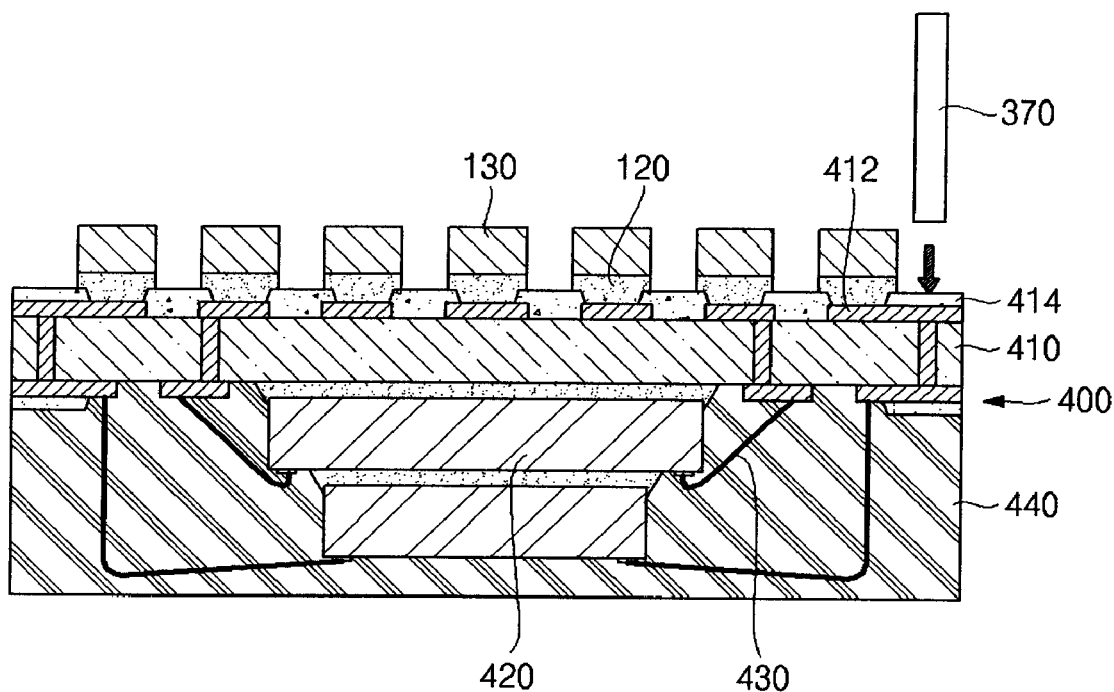

As shown in FIG. 6D, in grid of solder attach film operation S6d, the flux layer 120 and the solder layer 130 remain in only the areas corresponding to the electrically conductive pads 412, and the flux layer 120 and the solder layer 130 in the other areas not corresponding to the electrically conductive pads 412 are removed. For example, a blade or a laser 370 is used to remove the flux layer 120 and the solder layer 130 from the areas not corresponding to the electrically conductive pads 412. Here, when the solder attach film 200 including the barrier ribs 250 is used, the gridding is not needed. That is, when the second cover film 140 and the barrier ribs 250 are removed, the gridding is being spontaneously performed since the barrier ribs 250 have already been formed in the areas corresponding to the outer circumferences of the electrically conductive pads 412.

Figure 6E:
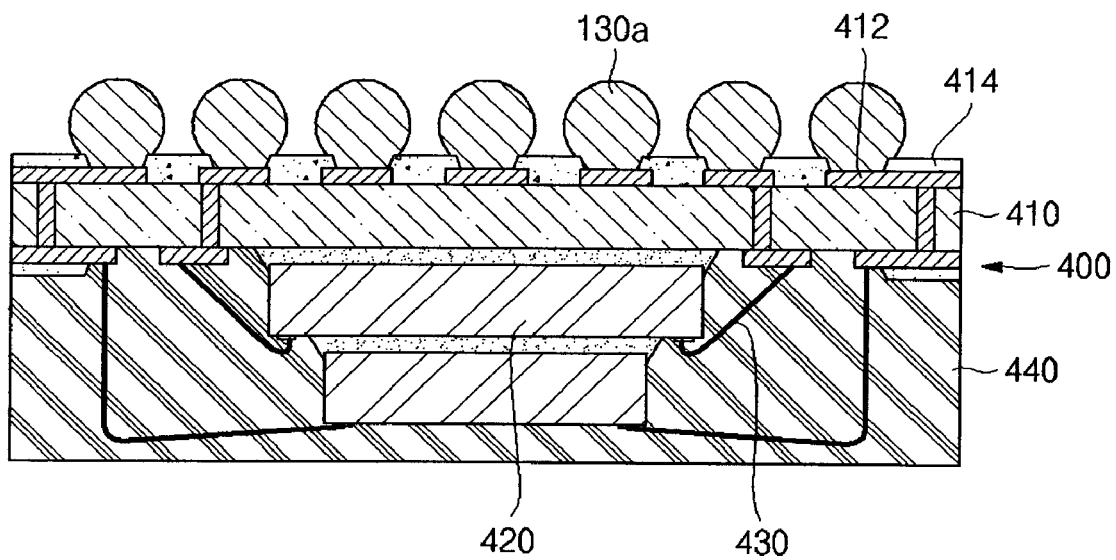

As shown in FIG. 6E, in reflow operation S6e, the semiconductor package 400, the flux layer 120, and the solder layer 130 are put into a furnace. Then, the flux layer 120 is volatilized and removed, and the solder layer 130 is fused and fixed to the electrically conductive pads 412, so that solder balls 130a are formed. Here, when the solder layer 130 is fused, the solder layer 130 has a spherical shape due to the surface tension thereof. Therefore, when the solder balls 130a are cooled down, they have substantially spherical shapes. In addition, the internal temperature of the furnace is set in the range of about 150 to 250° C., which makes it possible to sufficiently fuse the solder layer 130.

Referring to FIGS. 7A to 7E, cross-sectional views of a solder ball forming method according to still another embodiment of the invention are illustrated.

The solder ball forming method shown in FIGS. 7A to 7E are similar to the solder ball forming method shown in FIGS. 6A to 6E. Therefore, a description will be focused on the difference therebetween.

Figure 7A:
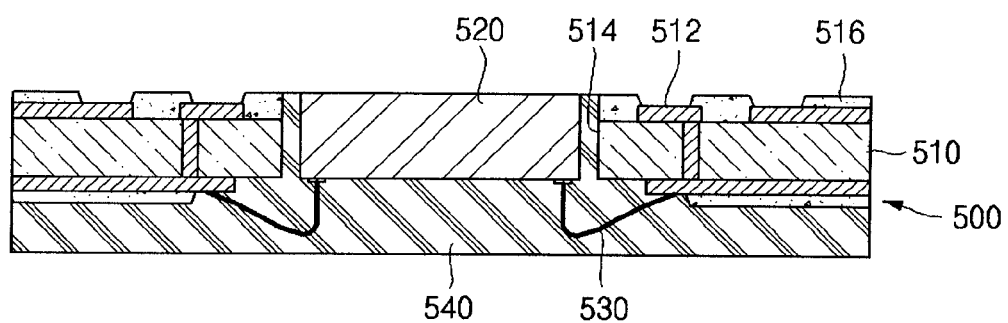
FIGS. 7A to 7E are cross-sectional views of a solder ball forming method according to still another embodiment of the invention.
Figure 7B:
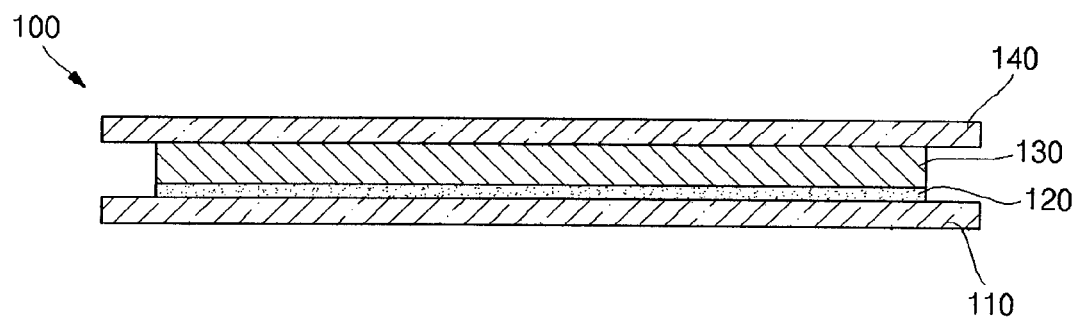
Figure 7C:
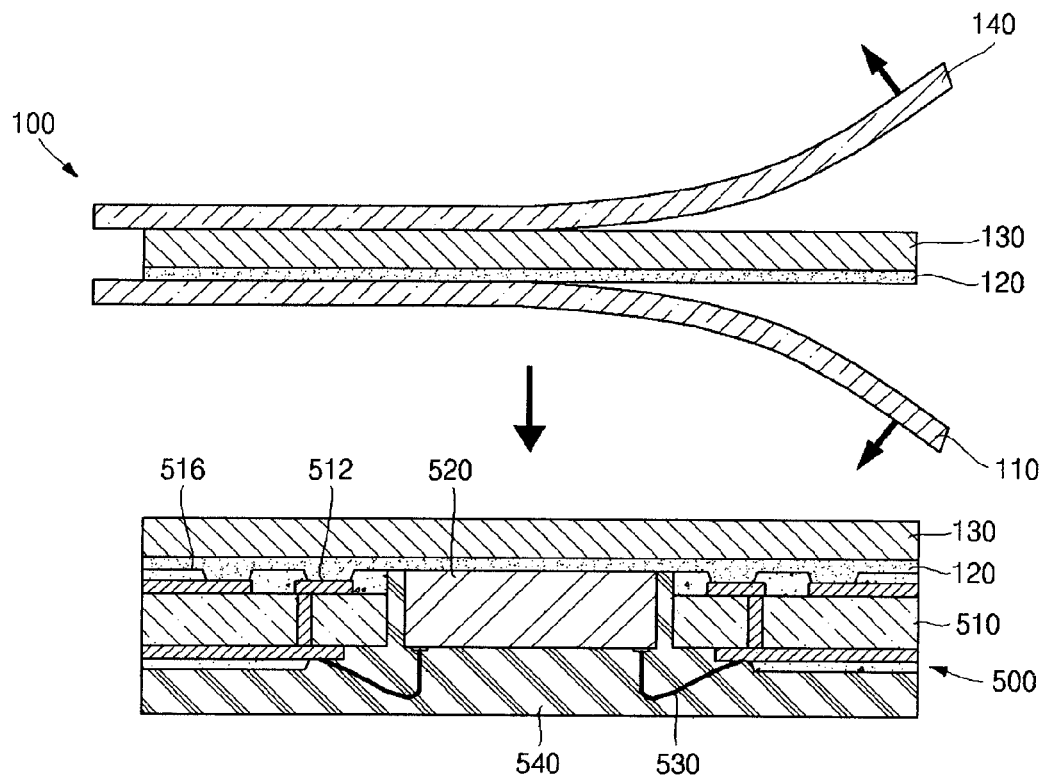
Figure 7D:
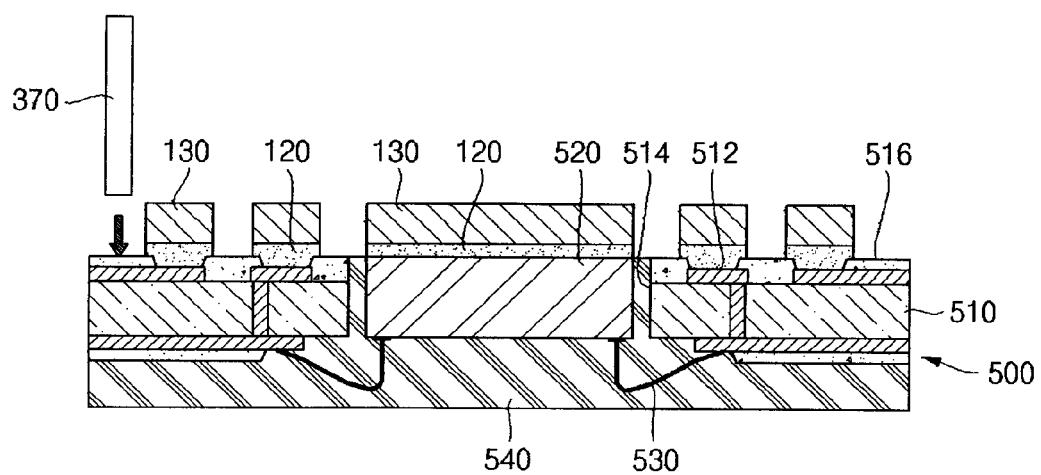
Figure 7E:
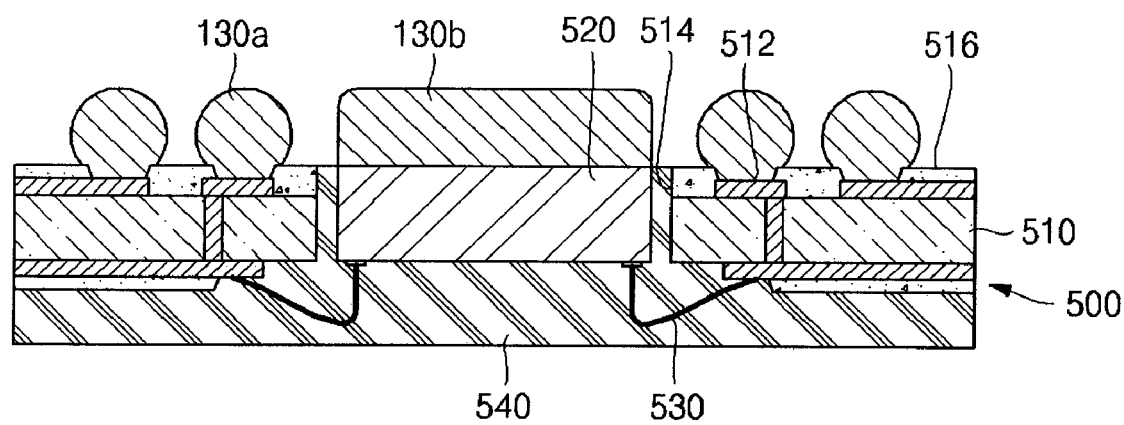

As shown in FIGS. 5, 7A to 7E the solder ball forming method according to another embodiment of the present invention includes prepare semiconductor package operation S6a (FIG. 7A), prepare solder attach film operation S6b (FIG. 7B), adhere solder attach film operation S6c (FIG. 7C), grid of solder attach film operation S6d (FIG. 7D), and reflow operation S6e (FIG. 7E).

As shown in FIG. 7A, in prepare semiconductor package operation S6a, a semiconductor package 500 including a substrate 510 that has a plurality of electrically conductive pads 512 formed thereon and has an aperture 514 formed in the center, at least one semiconductor die 520 positioned in the aperture 514 of the substrate 510, one or more electrically conductive wires 530 for electrically connecting the substrate 510 and the semiconductor die 520, and an encapsulant 540 for encapsulating the semiconductor die 520 and the electrically conductive wires 530 is prepared. Here, on the electrically conductive pads 512 formed on the substrate 510, a solder ball is fused and fixed to a portion of each electrically conductive pad 512, and the other portions of each electrically conductive pad 512 are covered with a protective layer 516. In addition, one side of the semiconductor die 520 is exposed to outside. The semiconductor package 500 is just an illustrative example for explaining the method of forming the solder balls according to the present invention, but the invention is not limited to the semiconductor package 500 according to the embodiment of the invention.

As shown in FIG. 7B, in prepare solder attach film operation S6b, the solder attach film 100 including the first cover film 110, the flux layer 120 formed on the first cover film 110, the solder layer 130 formed on the flux layer 120, and the second cover film 140 formed on the surface of the solder layer 130 is prepared. Although not shown in FIG. 7B, the solder attach film 200 (see FIG. 2) further including the barrier ribs 250 that are provided between the first cover film 110 and the second cover film 140 so at to penetrate the flux layer 120 and the solder layer 130 may be prepared.

As shown in FIG. 7C, in adhere solder attach film operation S6c, the first cover film 110 is removed from the solder attach film 100, and the flux layer 120 is adhered to both the electrically conductive pads 512 formed on the substrate 510 of the semiconductor package 500 and the exposed surface of the semiconductor die 520. Of course, the electrically conductive pad 512 is disposed at a position slightly lower than the protective layer 516, but the flux layer 120 is adhered to both the protective layer 516 and the electrically conductive pads 512 well since it has a little flexibility. Subsequently, the second cover film 140 is removed from the solder attach film 100, so that the solder layer 130 is exposed to outside.

As shown in FIG. 7D, in grid of solder attach film operation S6d, the flux layer 120 and the solder layer 130 remain in only the areas corresponding to the electrically conductive pads 512 and the exposed surface of the semiconductor die 520, and the flux layer 120 and the solder layer 130 in the other areas not corresponding to the electrically conductive pads 512 and the surface of the semiconductor die 520 are removed. For example, a blade or a laser 370 is used to remove the flux layer 120 and the solder layer 130 from the areas not corresponding to the electrically conductive pads 512 and the semiconductor die 520. Here, when the solder attach film 200 including the barrier ribs 250 is used, the gridding is not needed. That is, when the second cover film 140 and the barrier ribs 250 are removed, the gridding is being spontaneously performed since the barrier ribs 250 have already been formed in the areas corresponding to the outer circumferences of the semiconductor die 520 and the electrically conductive pads 512.

Finally, as shown in FIG. 7E, in reflow operation S6e, the semiconductor package 500, the flux layer 120, and the solder layer 130 are put into a furnace. Then, the flux layer 120 is volatilized and removed, and the solder layer 130 is fused and fixed to the electrically conductive pads 512, so that solder balls 130a are formed. At that time, the solder layer 130 is also fused and fixed to the semiconductor die 520 to form a solder region 130b. In addition, the internal temperature of the furnace is suitably set in the range of about 150 to 250° C. Since the area of the electrically conductive pad 512 is relatively small, the solder ball 130a is formed in a substantially spherical shape. Since the area of the semiconductor die 520 is relatively large, the solder region 130b is formed in a substantially rectangular shape.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A solder ball forming method comprising:
preparing a semiconductor die comprising a plurality of electrically conductive pads formed on a surface thereof;
preparing a solder attach film comprising a first cover film, a flux layer formed on the first cover film, a solder layer formed on the flux layer, and a second cover film formed on the solder layer, and barrier ribs formed between the first cover film and the second cover film so as to penetrate the flux layer and the solder layer;
removing the first cover film from the solder attach film;
adhering the solder attach film such that the flux layer is adhered to the surface of the semiconductor die and the barrier ribs are aligned to areas not corresponding to the electrically conductive pads;
removing the second cover film so the flux layer and the solder layer remain in the areas corresponding to the electrically conductive pads;
and putting the semiconductor die, the flux layer, and the solder layer into a furnace to volatilize and remove the flux layer and to fuse and fix the solder layer to the electrically conductive pads, thereby forming solder balls.

2. The solder ball forming method according to claim 1, wherein the solder layer is one selected from the group consisting of a Sn—Pb alloy, a Sn—Pb—Ag alloy, a Sn—Ag alloy, a Sn—Ag—Cu alloy, and a Sn—Pb—Bi alloy.

3. A solder ball forming method comprising:
preparing a semiconductor package comprising a substrate, a semiconductor die electrically connected to the substrate, and a plurality of electrically conductive pads formed on the substrate;
preparing a solder attach film comprising a first cover film, a flux layer formed on the first cover film, a solder layer formed on the flux layer, and a second cover film formed on the solder layer, and barrier ribs formed between the first cover film and the second cover film so as to penetrate the flux layer and the solder layer;
removing the first cover film from the solder attach film;
adhering the solder attach film such that the flux layer is adhered to a surface of the substrate of the semiconductor package and the barrier ribs are aligned to areas not corresponding to the electrically conductive pads;
removing the second cover film so the flux layer and the solder layer remain in the areas corresponding to the electrically conductive pads of the substrate;
and putting the semiconductor package, the flux layer, and the solder layer into a furnace to volatilize and remove the flux layer and to fuse and fix the solder layer to the electrically conductive pads, thereby forming solder balls.

4. The solder ball forming method according to claim 3, wherein the solder layer is one selected from the group consisting of a Sn—Pb alloy, a Sn—Pb—Ag alloy, a Sn—Ag alloy, a Sn—Ag—Cu alloy, and a Sn—Pb—Bi alloy.

5. The solder ball forming method according to claim 3 wherein an aperture is formed in the substrate, the semiconductor die being positioned in the aperture.

6. The solder ball forming method according to claim 5 wherein the adhering the solder attach film comprises adhered the flux layer to a surface of the semiconductor die that is exposed through the aperture of the substrate.

7. The solder ball forming method according to claim 6 wherein the flux layer and the solder layer remain in the area corresponding to the surface of the semiconductor die exposed through the aperture of the substrate; and the solder layer into a furnace further comprises fusing and fixing the solder layer to the surface of the semiconductor die, thereby forming a solder region.

* * * * *

UNITED STATES PATENT AND TRADEMARK OFFICE
CERTIFICATE OF CORRECTION

PATENT NO. : 7,718,523 B1  Page 1 of 1
APPLICATION NO. : 11/875597
DATED : May 18, 2010
INVENTOR(S) : Min Yoo, Tae Seong Kim and Ji Young Chung It is certified that error appears in the above-identified patent and that said Letters Patent is hereby corrected as shown below:

In Column 8, Line 55, Claim 7, after "the aperture of the substrate;", insert --and wherein the putting the semiconductor package, the flux layer,--.

Signed and Sealed this

Twenty-seventh Day of July, 2010

David J. Kappos
*Director of the United States Patent and Trademark Office*